United States Patent
DCamp et al.

(10) Patent No.: US 7,491,581 B2
(45) Date of Patent: Feb. 17, 2009

(54) DICING TECHNIQUE FOR FLIP-CHIP USP WAFERS

(75) Inventors: Jon B. DCamp, Savage, MN (US); Harlan L. Curtis, Champlin, MN (US)

(73) Assignee: Honeywell International Inc., Morristown, NJ (US)

( * ) Notice: Subject to any disclaimer, the term of this patent is extended or adjusted under 35 U.S.C. 154(b) by 122 days.

(21) Appl. No.: 11/615,712

(22) Filed: Dec. 22, 2006

(65) Prior Publication Data

US 2008/0150160 A1    Jun. 26, 2008

(51) Int. Cl.
*H01L 21/00* (2006.01)
(52) U.S. Cl. .................. 438/108; 438/113; 438/127
(58) Field of Classification Search .......... 438/108, 438/113, 127
See application file for complete search history.

(56) References Cited

U.S. PATENT DOCUMENTS

| | | | |
|---|---|---|---|
| 6,822,326 B2 * | 11/2004 | Enquist et al. | 257/729 |
| 7,303,645 B2 * | 12/2007 | Yang et al. | 156/299 |
| 2005/0006738 A1 * | 1/2005 | Schaper et al. | 257/678 |
| 2007/0001247 A1 * | 1/2007 | Patel et al. | 257/414 |

* cited by examiner

*Primary Examiner*—Trung Dang
(74) *Attorney, Agent, or Firm*—Black Lowe & Graham PLLC

(57) ABSTRACT

A method and a fused compound wafer including at least one first MEMS sensor and at least second MEMS sensor includes a first wafer. The first wafer includes at least one first MEMS sensor first subassembly and at least one second MEMS sensor first subassembly. A second wafer includes at least one first MEMS sensor second subassembly, at least one second MEMS sensor second assembly, and a fusing matrix. The fusing matrix includes a first joint configured to encapsulate each of the at least one first MEMS sensor first assembly and each of the at least one first MEMS sensor second assembly forming each at least one first MEMS sensor. A second joint is configured to encapsulate each of the at least one second MEMS first subassembly and each of the at least one second MEMS second subassembly forming each at least one second MEMS sensor.

6 Claims, 4 Drawing Sheets

DICING TECHNIQUE FOR FLIP-CHIP USP WAFERS

BACKGROUND OF THE INVENTION

Micro-Electrical Mechanical System (MEMS) sensors are fabricated multiply on silicon wafers and are then cut into individual chips by use of a wafer saw. Sawing is the final step in semiconductor fabrication. The wafer saw uses diamond-tipped circular saws to saw the patterned wafers into individual semiconductor chips. The saw uses numerical controls to step across a wafer and cut the exact lines that define a chip. The wafer saw can only cut in a straight line at a selected depth. The wafer saw completely traverses the wafer rather than stopping in the middle of the wafer.

Fabrication of MEMS sensors is accomplished by building up the wafer into multiple individualized units and then completing and sealing the unit with a domed insert that is pressed into place. Sealing each unit requires placement of individual domes by distinct movements of robotic arms and numerous pressings. Each movement has a fixed cost and a non-zero probability of failure.

What is needed in the art is a means of sealing multiple chips with fewer robotic movements to conserve costs of production.

SUMMARY OF THE INVENTION

A method and a compound wafer including at least one first MEMS sensor and at least one second MEMS sensor includes a first wafer. The first wafer includes at least one first MEMS sensor first subassembly and at least one second MEMS sensor first subassembly. A second wafer includes at least one first MEMS sensor second subassembly, at least one second MEMS sensor second assembly, and a fusing matrix. The fusing matrix includes a first joint configured to encapsulate each of the at least one first MEMS sensor first assembly and each of the at least one first MEMS sensor second assembly forming each at least one first MEMS sensor. A second joint is configured to encapsulate each of the at least one second MEMS first subassembly and each of the at least one second MEMS second subassembly forming each at least one second MEMS sensor.

The method eliminates individual domes, substituting a monolithic second wafer having expendable material between sites for each MEMS sensor. The second wafer is fused to the first wafer by means of the fusing matrix to form the compound wafer. The fusing matrix is configured to fuse the second wafer to the first wafer forming distinct sealed silicon chips. Fusing is optionally performed substantially at vacuum resulting in chips sealed to contain MEMS sensor dies to operate at vacuum or near vacuum conditions. In an alternate method, fusing occurs in a selected gas ambient resulting in MEMS sensor dies operating in gas-filled chip.

Individuating the chips from the wafer may be accomplished by a series of at least three cuts. The three cuts are all readily accomplished with existing wafer saws thereby alleviating much of the capital cost associated with changes in manufacturing methods. A first and a second cut occur at a depth sufficient to transect the second wafer to remove the expendable material. With the removal of the material, traces that underlie the second wafer are exposed allowing electrical connection to the MEMS sensor within the sealed chip. In one embodiment, contacts contact the traces to also provide electrical connection to the MEMS sensor die affixed to the second wafer. The third cut separates the fused wafers into distinct chips.

As will be readily appreciated from the foregoing summary, the resulting chips are formed without individual placement of domes to seal the chips, thereby decreasing costs of production.

BRIEF DESCRIPTION OF THE DRAWINGS

Preferred and alternative embodiments of the present invention are described in detail below with reference to the following drawings.

DETAILED DESCRIPTION OF THE PREFERRED EMBODIMENT

Figure 1:
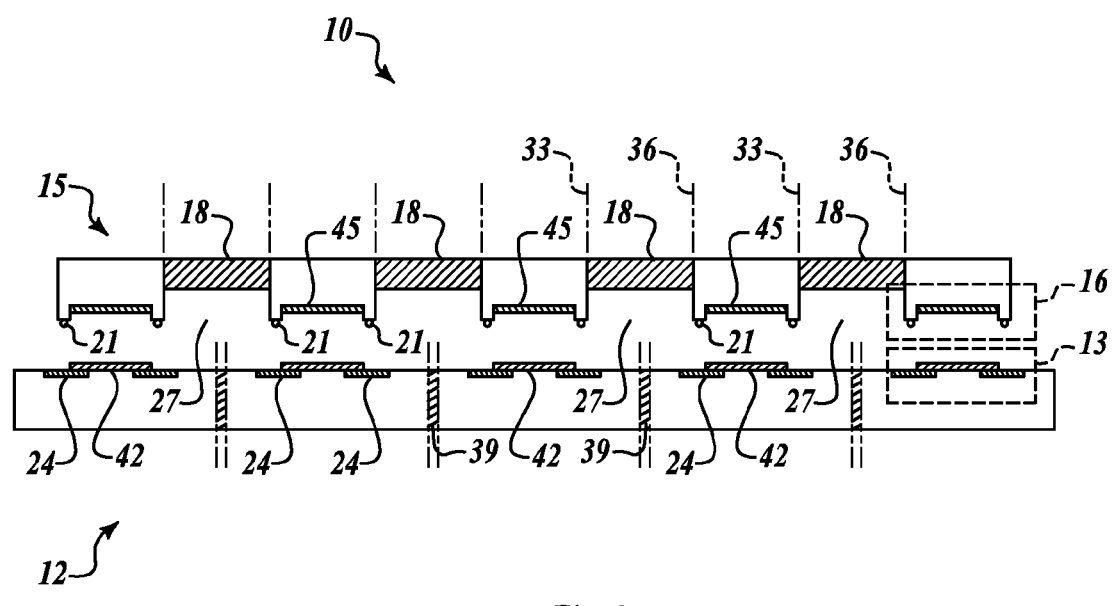
FIG. 1 is a cross-section view of a first and a second wafer.

Referring to FIG. 1, a compound wafer 10 is formed of a first wafer 12 and a second wafer 15. The first wafer 12 is formed to include at least two MEMS sensor first subassemblies 13 having traces 24 and a MEMS mechanism 42. The second wafer 15 is formed to include at least two MEMS sensor second subassemblies 16 having contacts 21 and sense plates 45 in electrical connection with at least one of the contacts 21.

To divide the second wafer 15, into individuated chips each containing a MEMS sensor second subassembly 16, first, interspace material 18 is removed. According to one non-limiting embodiment, a first kerf 33 and second kerf 36 are located to define the interspace material 18. Once the two kerfs are cut the interspace material 18 is separated. To allow ready separation of the interspace material 18, a channel 27 is etched out of the second wafer 15 generally between the first kerf 33 and the second kerf 36. Alternately, a single first kerf 33 may be configured to be broad enough to entirely remove the interspace material 18 in a single pass of the wafer saw. In such a non-limiting embodiment, the depth of the first kerf 33 is selected to assure removal only of the interspace material without damage to the traces 24.

The exemplary embodiment described herein divides at least two MEMS sensors 14 (FIGS. 2, 3) into the at least two MEMS sensor first subassemblies 13 and the at least two MEMS sensor second subassemblies 16 in a non-limiting exemplary manner. For example, forming the second MEMS sensor subassemblies 16 to include the MEMS mechanism 42, while the first MEMS sensor subassemblies 14 includes the sense plate 45 is suitably accomplished in an alternate embodiment. Selection of particular components for inclusion in the first MEMS sensor subassembly 13 as opposed to the second MEMS sensor subassembly 16 will be dictated by the ease of assembly as a compound wafer 10 and economies achieved thereby.

In the non-limiting exemplary embodiment of the compound wafer 10 the first wafer 12 is fabricated to include the at least two MEMS sensor first subassemblies 13. The MEMS sensor first subassembly, in the non-limiting example, includes at least one trace 24 in electrical connection to the MEMS mechanisms 42. The at least one trace 24 is readily configured to connect to the MEMS mechanism 42 and to extend away from the MEMS mechanism 42 toward a third kerf 39 (shown intact) on the surface of the first wafer 12.

The second wafer 15 is configured to include at least one second MEMS sensor subassembly 16, which, in the non-limiting example, includes the sense plate 45 in electrical connection with at least one contact 21. In this non-limiting embodiment, the contact 21 is portrayed as member of a ball grid array.

In the non-limiting embodiment, the ball grid array is selected as a surface-mount contact set. Generally a ball grid array contact is a bead of solder between a first and a second conductive trace such as the trace 24. Arrays of these joints are used to mount chips on silicon substrates. In this non-limiting embodiment, ball grid array contacts are well-suited for use as a contact 21 is readily deformed upon contact to conform to the trace 24.

Figure 2:
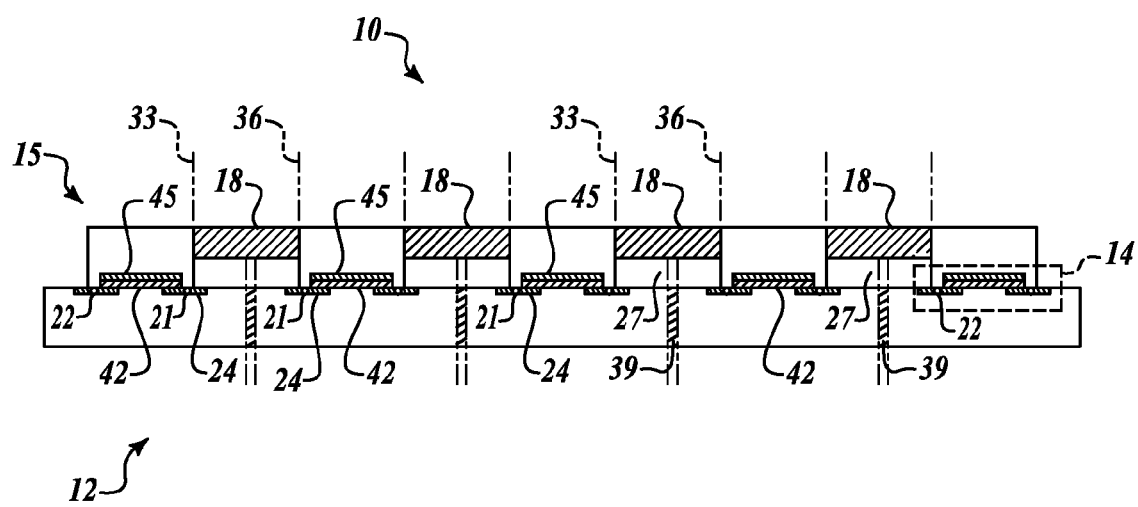
FIG. 2 is a cross-section view of a fused compound wafer.

Referring to FIG. 2, the compound wafer 10 is formed when the second wafer 15 is brought into fusing contact with the first wafer 12. Notably, the contact 21 has deformed upon fusing contact to conform to the trace 24 and to reliably provide electrical continuity between the trace 24, and in this non-limiting example, the sense plate 45. Additionally, fusing silicon or silicon compounds not only form a joint 22 between the first wafer 12 and the second wafer 15, but also sealingly encapsulate the contact 21. The joint 22, thereby, encompasses each of the MEMS sensors 14. The remaining components, the first wafer 12, the MEMS sensor first subassemblies 13, the traces 24, the MEMS mechanism 42, the second wafer 15, the MEMS sensor second subassemblies 16 and the sense plates 45, the first kerf 33 and second kerf 36, and the interspace material 18, remain generally as portrayed in FIG. 1.

Figure 3:
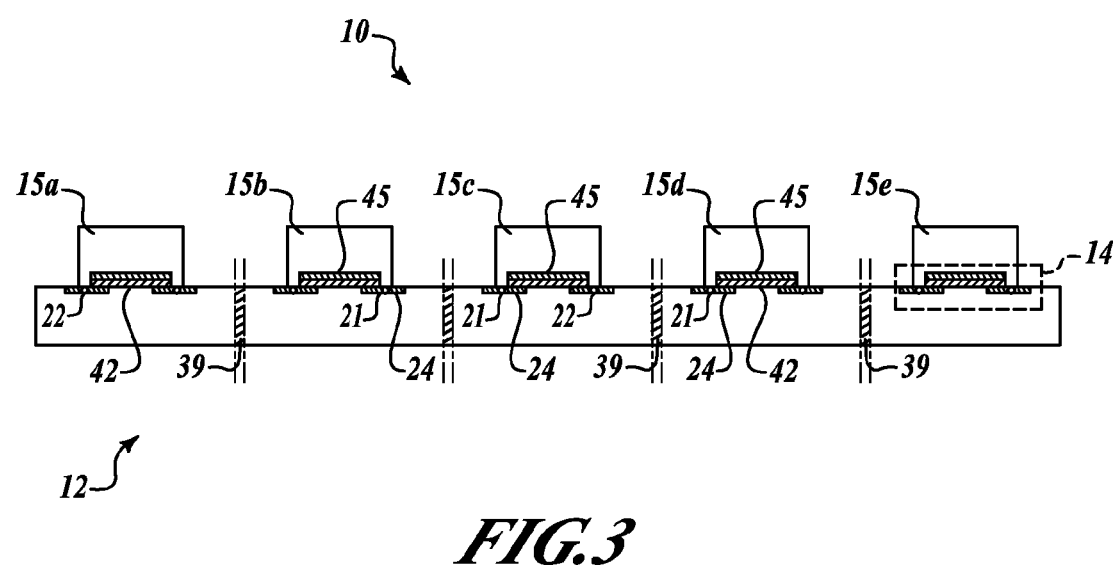
FIG. 3 is a cross-section view of the fused compound wafer with interspace material removed.

Referring to FIG. 3, cuts at the first kerf 33 (FIGS. 1, 2) and the second kerf 36 (FIGS. 1, 2) have detached the interspace material 18 (FIGS. 1, 2) from the second wafer 15 (FIGS. 1, 2) dividing it into individuated domes 15a, 15b, 15c, 15d, and 15e. The MEMS sensor 14, including the sense plate 45 and the MEMS mechanism 42 enclosed by the joint 22. Removal of the interspace material 18 (FIGS. 1, 2) exposes the traces 24 to allow electrical continuity between the MEMS sensor 14 hermetically sealed by the joints 22 devices connected to the traces 24. Further singulation of the first wafer 12 at the third kerfs 39, can be accomplished by straight line sawing. As a result of singulation, the first wafer 12 and singulated domes 15a, 15b, 15c, 15d, and 15e become individual sealed MEMS chips with exposed traces 24.

Figure 4:
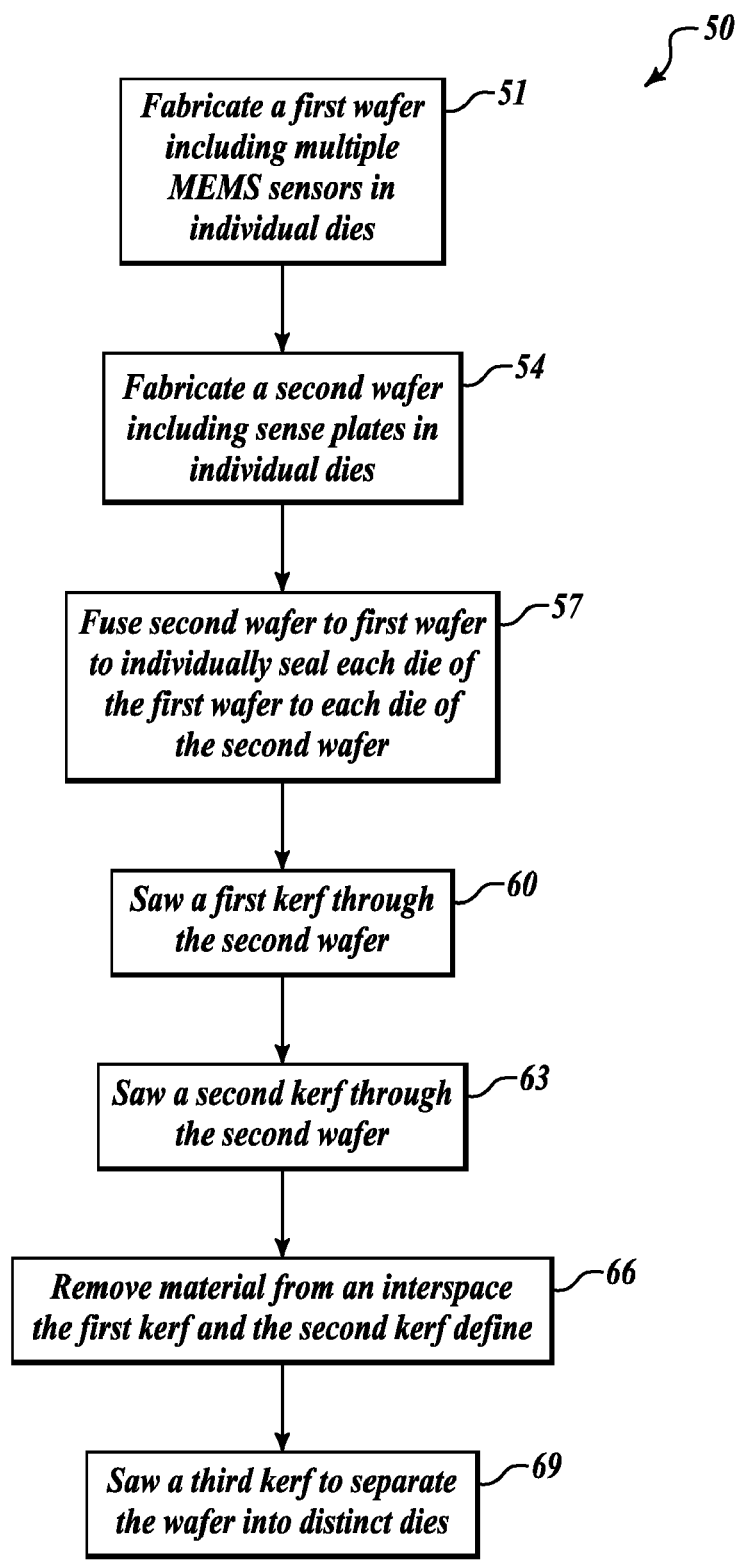
FIG. 4 is a flow chart indicating a method for fabricating a fused compound wafer.

As shown in FIG. 4, a method 50 for fabricating MEMS chips includes fabricating a first wafer at a block 51. Fabrication of the first wafer includes fabrication at least two MEMS sensors though not, necessarily, identical MEMS sensors. MEMS fabrication might, optionally, be by any of several methods or a combination thereof but, generally fabrication techniques are by either of bulk micromachining or surface micromachining methods or a combination thereof.

Bulk micromachining has a relatively long history of research and development and is based on a combination of isotropic and anisotropic etchings of single-crystalline silicon to form micromechanical structures from the bulk of the silicon wafer. Deep reactive-ion etching (DRIE) is, generally used, to enable two-dimensioned design freedom in creating microstructures with high aspect ratios.

Surface micromachining, on the other hand, is based on sequential deposition and etching of thin films on the surface of a carrier substrate. One or more intermediate thin films (the sacrificial layers) may be removed in alternate steps, leaving the subsequently deposited thin film structures hanging or released from the substrate. These hanging structures form the proof mass and the spring suspensions for accelerometers, or the micromirrors in digital light processors.

In fabricating the first wafer, traces are included to provide electrical paths for power and signals that are necessary for operation of the fabricated device in final form.

At a block 54, a second wafer is fabricated to complement the first wafer. The second wafer is generally fabricated by similar techniques as the first and is accomplished to provide completing components to those fabricated in the first wafer. Contacts, in positions corresponding to those of the traces on the first wafer, may be fabricated on the second wafer.

At a block 57, the first wafer is fused to the second wafer in a manner that unites the contacts to the traces and completes MEMS sensor by uniting complementary MEMS components on the first and second wafers. Fusing the first wafer to the second wafer acts to seal the wafers at joints in a fusing matrix across the resulting compound wafer. The joints encompass each of the resulting MEMS sensors hermetically sealing the units. Each joint is configured to include a joint interior aspect generally facing the encompassed MEMS sensor and a joint exterior aspect in opposed relation to the joint interior aspect. In an embodiment, the joints encapsulate the contacts in contact with the traces to envelop the contact to trace junction with silicon or silicon oxides.

While one embodiment can include fusing to hermetically seal the units, alternate means can be used to bond the first wafer to the second wafer. Anodic bonding is used, by way of non-limiting example. Anodic bonding is a method of hermetically and permanently joining glass to silicon without the use of adhesives. The silicon and glass wafers are heated to a temperature (typically in the range 300-500° C. depending on the glass type) at which the alkali-metal ions in the glass become mobile. The components are brought into contact and a high voltage applied across them. The resulting electrical field causes the alkali cations to migrate from the interface resulting in a depletion layer with high electric field strength. The resulting electrostatic attraction brings the silicon and glass into intimate contact. Further current flow of the oxygen anions from the glass to the silicon results in an anodic reaction at the interface and the result is that the glass becomes bonded to the silicon with a permanent chemical bond.

Still another embodiment may optionally employ direct bonding. Any two flat, highly polished, clean surfaces will stick together if they are brought into contact. The bond is of the Van der Waal's or hydrogen type and is of low strength, but can be significantly improved by thermal treatment. This process has been successfully exploited for MEMS fabrication, using silicon such as silicon bonding with either plain or oxidized wafers. Because of the thermal treatment the technique has often been referred to as silicon fusion bonding.

The high temperature (typically 1000° C.) that has been required to achieve acceptable bond strength has been a limitation with regard to applications using silicon direct bonding. However recent developments in surface preparation (e.g. using plasma activation), have demonstrated that high temperatures are not necessarily needed. In MEMS design, lower temperature direct bonding is advantageous as it enables stress-free bonds to be achieved at temperatures that are compatible with metallization layers and opens up a much larger range of applications for silicon direct bonding. The initial bonding is normally done at room temperature with some force applied. Some wafer bonders include a special pin chuck to ensure that when the bond forms it does so starting at the center and works towards the wafer edges, thus ensuring no trapped air at the interface. Starting at the center reduces voids in the bonding and leads to better quality, higher yield bonds.

At a block 60, a first kerf is spaced apart from the joint exterior aspect of a joint encompassing a first MEMS sensor. In an embodiment, a wafer saw is used to cut the first kerf. The first kerf is cut at a depth sufficient to transect the second wafer without penetration of the either of the first wafer or the traces.

At a block 63, a second kerf is spaced apart from the joint exterior aspect of a joint encompassing a second MEMS sensor.

At a block 66, material between the first kerf and the second kerf is removed to expose the traces. In one embodiment, in the fabrication of the second wafer at the block 54, channels are defined in the second wafer, prior to fusing, to facilitate the removal of material. The defined channels assure localization of the fusing joints by presenting limited sections of the second wafer for fusing. Removal of the material results in suitable exposition of the traces.

At a block 69, the first wafer is sawn along the third kerfs to produce singulated chips. The resulting chips each encase a MEMS sensor in hermetically sealed capsule having exposed traces suitable for flip chip configuration.

While the preferred embodiment of the invention has been illustrated and described, as noted above, many changes can be made without departing from the spirit and scope of the invention. For example, traces may be formed on the second wafer to mate with contacts formed on the first wafer. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A method for fabricating at least one first MEMS sensor and at least one second MEMS sensor, the method comprising:
    fabricating a first wafer including at least one first MEMS sensor first subassembly and at least one second MEMS sensor first subassembly;
    fabricating a second wafer including at least one first MEMS sensor second subassembly corresponding with each at least one first MEMS sensor first subassembly and at least one second MEMS sensor second subassembly corresponding with each at least one second MEMS sensor first subassembly;
    bringing the second wafer in to contact with the first wafer to align the at least one first MEMS sensor second subassembly with the at least one first MEMS sensor first subassembly forming at least one first MEMS sensor and to align the at least one second MEMS sensor second subassembly with the at least one second MEMS sensor first subassembly forming at least one second MEMS sensor; and
    fusing the second wafer to the first wafer encompassing each at least one first MEMS sensor with a first joint having an first joint interior aspect oriented toward the at least one first MEMS sensor and a first joint exterior aspect oriented away from the MEMS sensor and with a second joint encompassing each at least one second MEMS sensor having a second joint interior aspect orient toward the at least one second MEMS sensor and a second joint exterior aspect oriented away from the MEMS sensor.

2. The method of claim 1, further comprising:
    removing material from an interspace by sawing a first kerf spaced substantially proximate first exterior aspect at a depth to completely transect the second wafer without substantially penetrating the first wafer.

3. The method of claim 2 further comprising:
    sawing a second kerf substantially proximate to the second exterior aspect and spaced apart from the first kerf; and
    removing material of the second wafer from the interspace defined by the first kerf and the second kerf.

4. The method of claim 2, wherein:
    the first and second MEMS first subassemblies each include at least one trace; and
    the removing material includes exposing the at least one trace.

5. The method of claim 4, wherein:
    the first and second MEMS second subassemblies each include at least one contact; and
    the bringing the second wafer in to contact with the first wafer includes contacting at least one contact with the at least one trace.

6. The method of claim 1, wherein the fabricating a second wafer includes:
    defining a channel extending from substantially the first joint to substantially the second joint.

* * * * *